(12) United States Patent
Durlam et al.

(10) Patent No.: US 6,888,743 B2
(45) Date of Patent: May 3, 2005

(54) MRAM ARCHITECTURE

(75) Inventors: Mark A. Durlam, Chandler, AZ (US); Thomas W. Andre, Austin, TX (US); Brian R. Butcher, Gilbert, AZ (US); Mark F. Deherrera, Tempe, AZ (US); Bradley N. Engel, Chandler, AZ (US); Bradley J. Garni, Austin, TX (US); Gregory W. Grynkewich, Gilbert, AZ (US); Joseph J. Nahas, Austin, TX (US); Nicholas D. Rizzo, Gilbert, AZ (US); Saied Tehrani, Tempe, AZ (US); Clarance J. Tracy, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 87 days.

(21) Appl. No.: 10/331,058

(22) Filed: Dec. 27, 2002

(65) Prior Publication Data

US 2004/0125646 A1 Jul. 1, 2004

(51) Int. Cl.$^7$ .............................................. G11C 11/02
(52) U.S. Cl. ....................................... 365/158; 365/173
(58) Field of Search ................................ 365/158, 157, 365/171, 173

(56) References Cited

U.S. PATENT DOCUMENTS

| | | | |
|---|---|---|---|
| 3,984,815 A | 10/1976 | Drexler et al. ................. 377/20 |
| 4,805,146 A | 2/1989 | Bruder et al. ................. 365/131 |
| 5,640,343 A | 6/1997 | Gallagher et al. ............ 365/171 |
| 5,702,831 A | 12/1997 | Chen et al. ................... 428/611 |
| 5,734,605 A | 3/1998 | Zhu et al. ..................... 365/173 |
| 5,793,697 A | 8/1998 | Scheuerlein ............ 365/230.07 |
| 5,894,447 A | 4/1999 | Takashima |
| 6,055,178 A | 4/2000 | Naji ............................. 365/158 |
| 6,081,446 A | 6/2000 | Brug et al. ................... 365/171 |
| 6,097,626 A | 8/2000 | Brug et al. ................... 365/171 |
| 6,111,783 A | 8/2000 | Tran et al. ................... 365/171 |
| 6,128,239 A | 10/2000 | Perner ......................... 365/209 |
| 6,205,073 B1 | 3/2001 | Naji ............................. 365/209 |
| 6,256,224 B1 | 7/2001 | Perner et al. ................ 365/173 |
| 6,256,247 B1 | 7/2001 | Perner ......................... 365/209 |
| 6,259,644 B1 | 7/2001 | Tran et al. ................... 365/209 |
| 6,331,943 B1 | 12/2001 | Naji et al. .................... 365/158 |
| 6,365,419 B1 | 4/2002 | Durlam et al. ................. 438/3 |
| 6,510,079 B2 * | 1/2003 | Viehmann ................... 365/158 |
| 6,512,689 B1 * | 1/2003 | Naji et al. .................... 365/158 |
| 6,545,906 B1 | 4/2003 | Savtchenko et al. |
| 6,711,053 B1 * | 3/2004 | Tang ........................... 365/158 |
| 6,714,442 B1 * | 3/2004 | Nahas ......................... 365/158 |
| 6,714,443 B2 * | 3/2004 | Ooishi ......................... 365/171 |
| 2002/0037595 A1 | 3/2002 | Hosotani |
| 2002/0097598 A1 | 7/2002 | Hoenigschmid |

OTHER PUBLICATIONS

K.T.M. Ranmuthu, I.W. Ranmuthu, A.V. Pohm, C.S. Comstock M. Hassoun, "10–35 Nanosecond Magneto–Resistive Memories", IEEE Transactions on Magnetics, vol. 26, No. 5, Sep. 1990, Engineering Research Institute, Iowa State University.

I.W. Ranmuthu, K.T.M. Ranmuthu, C. Kohl, C.S. Comstock, M. Hassoun, "A 512K–Bit Mageneto Resistive Memory with Switched Capacitor Self–Referencing Sensing", IEEE Transactions on Circuits and Systems–II, Analog and Digital Signal Processing, vol. 39, No. 8, Aug. 1992.

* cited by examiner

Primary Examiner—Tan T. Nguyen
(74) Attorney, Agent, or Firm—Ingrassia, Fisher & Lorenz

(57) ABSTRACT

An MRAM architecture is provided that reduces the number of isolation transistors. The MRAM architecture includes magnetoresistive memory cells that are electrically coupled to form a ganged memory cell. The magnetoresistive memory cells of the ganged memory cell are formed with Magnetic Tunnel Junctions (MTJs) and formed without isolation devices, such as isolation transistors, and a programming line and a bit line are adjacent to each of the magnetoresistive memory cells. Preferably, the magnetoresistive memory cells of the ganged memory cell only include MTJs, and a programming line and a bit line are adjacent to each of the magnetoresistive memory cells.

23 Claims, 6 Drawing Sheets ns and programming lines are illustrated in this preferred embodiment and subsequently described exemplary embodiments, the MRAM architecture 20 can have more than four (4) and less than four (4) memory cells, ganged memory cells, bit lines and/or programming lines.

MRAM ARCHITECTURE

FIELD OF THE INVENTION

The present invention generally relates to a Magnetoresistive Random Access Memory, and more particularly to a Magnetoresistive Random Access Memory architecture with Magnetic Tunnel Junctions.

BACKGROUND OF THE INVENTION

Magnetoelectronics, spin electronics and spintronics are synonymous terms for the use of effects predominantly caused by electron spin. Magnetoelectronics is used in numerous information devices, and provides non-volatile, reliable, radiation resistant, and high-density data storage and retrieval. The numerous magnetoelectronics information devices include, but are not limited to Magnetic Random Access Memory (MRAM).

The architecture for MRAM is generally composed of magnetoresistive memory cells, programming lines, and bit lines intersecting the programming lines. The magnetoresistive memory cells are typically formed with a Magnetic Tunnel Junction (MTJ). In addition, each of the memory cells is typically formed with an isolation device that is configured to electrically isolate the memory cell from other memory cells when the magnetization state of the memory cell is read. For example, each of the memory cells is typically formed with an isolation transistor, such as a Metal Oxide Field Effect Transistor (MOSFET), which can be configured to electrically isolate the memory cell from other memory cells. Utilization of an isolation device, such as an isolation transistor, in each memory cell of MRAM limits the MRAM cell density, and increases in MRAM cell densities are continually sought. Accordingly, it is desirable to reduce the limits in MRAM cell density imposed with an isolation device in each memory cell, such as an isolation transistor in each memory cell.

In view of the foregoing, it is desirable to provide an MRAM architecture having one or more memory cells that are formed without an isolation device, such as an isolation transistor. In addition, it is desirable to provide an MRAM architecture with memory cells that only include an MTJ. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
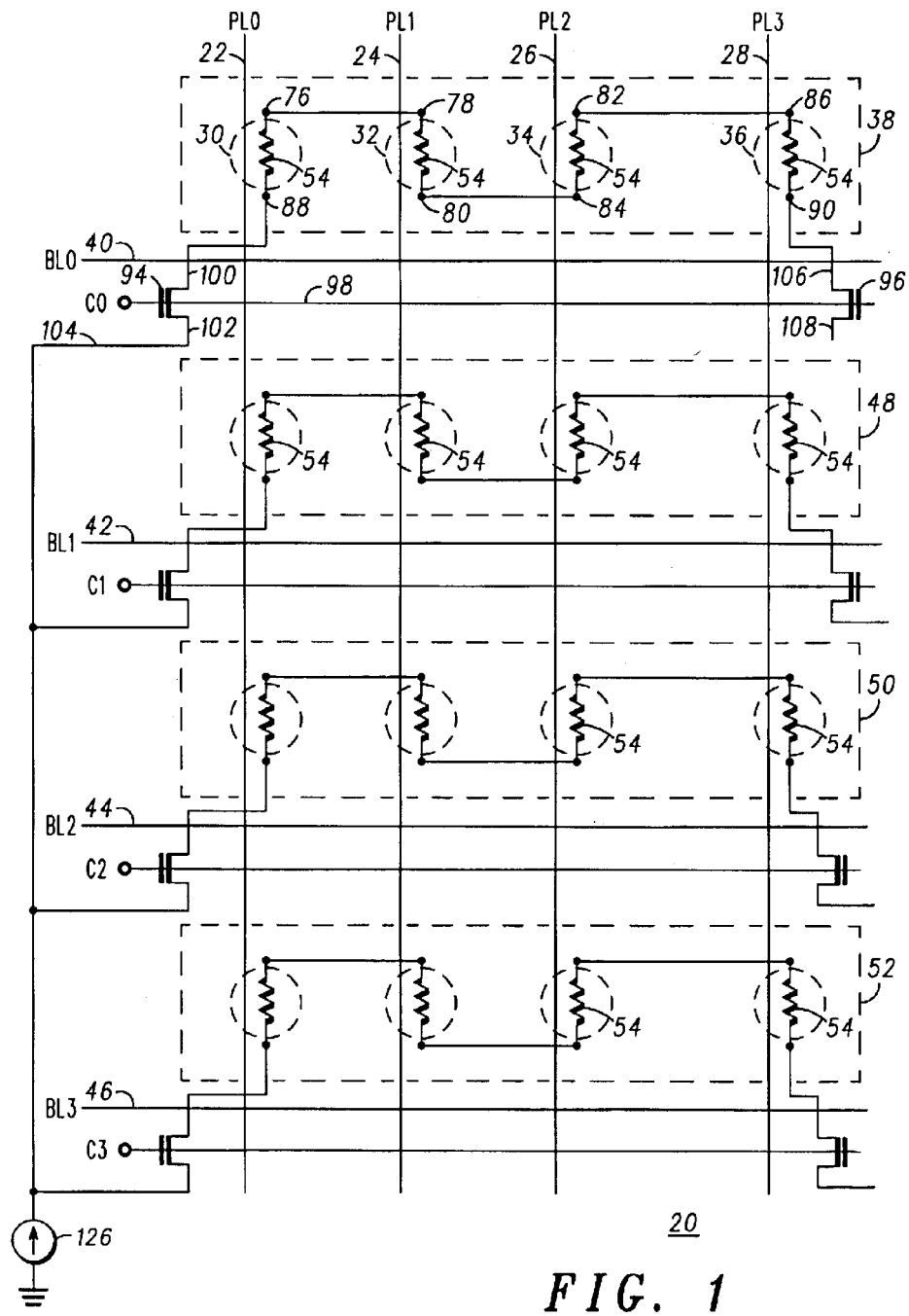
FIG. 1 is a schematic diagram of an MRAM architecture in accordance with a first exemplary embodiment of the present invention.

Referring to FIG. 1, an MRAM architecture 20 is illustrated in accordance with a first exemplary embodiment of the present invention. The MRAM 20 architecture includes at least a first programming line 22 and preferably includes programming lines (24,26,28) in addition to the first programming line 22. The MRAM architecture 20 also includes at least a first memory cell 30 adjacent to the first programming line 22 and a second memory cell 32 coupled to the first memory cell 30, and adjacent herein shall mean near, close or in actual contact to enable magnetic coupling. The first memory cell 30 and the second memory cell 32 are preferably coupled (e.g., electrically coupled) to other memory cells (34,36) to form a first ganged memory cell 38, which as used herein shall mean multiple memory cells that can be electrically isolated as a whole from other memory cells of the memory. In addition to the one or more programming lines (22,24,26,28) and the one or more memory cells (30,32,34,36) coupled to form the first ganged memory cell 38, the MRAM architecture 20 includes at least a first bit line 40 adjacent to the first memory cell 30 and more preferably adjacent to each of the memory cells (30,32,34,36) of the first ganged memory cell 38. Furthermore, additional bit lines (42,44,46) are preferably included in the MRAM architecture 20 that are adjacent to at least one memory cell of other ganged memory cells (48,50,52), which are preferably included in the MRAM architecture 20. While four (4) memory cells, ganged memory cells, bit lines and programming lines are illustrated in this preferred embodiment and subsequently described exemplary embodiments, the MRAM architecture 20 can have more than four (4) and less than four (4) memory cells, ganged memory cells, bit lines and/or programming lines.

At least one memory cell of the first ganged memory cell 38, such as the second memory cell 32, is formed with an MTJ 54, which is depicted as a simple resistor or a variable resistor, and at least one memory cell is formed without an isolation device that electrically isolates the memory cell from the other memory cells (30,34,36) of the first ganged memory cell 38 (i.e., an isolation device, such as an isolation transistor). Preferably, more than one of the memory cells (30,32,34,36) is formed with an MTJ 54 and without a device that electrically isolates the memory cell from the other memory cells of the ganged memory cell 38, and more preferably each of the memory cells is formed with an MTJ 54 and without a device that electrically isolates the memory cell from the other memory cells of the first ganged memory cell 38. Even more preferably, at least one of the memory cells (30,32,34,36) consists of an MTJ (i.e., the memory cell only has an MTJ, no more or no less), and most preferably each of the memory cells of the first ganged memory cell 38 consists of an MTJ 54. Furthermore, other ganged memory cells (48,50,52) shown in the figures and other memory cells of the MRAM that are not shown in the figures are preferably configured as previously described with reference to the first ganged memory cell 38. Therefore, at least N memory cells can be coupled (e.g., electrically coupled) and electrically isolated from other memory cells (e.g., selected) with M isolation devices, where N and M are integers and N is greater than M (i.e., N>M).

Figure 2:
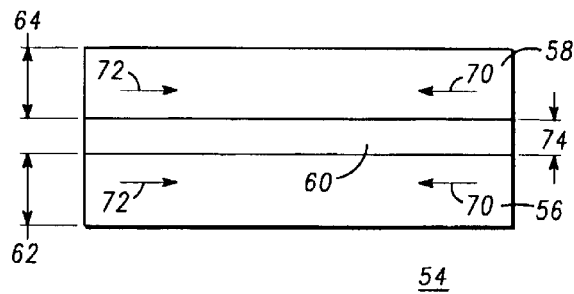
FIG. 2 is a simplified side view of an exemplary MTJ.

Referring to FIG. 2, a simplified side view is provided for an exemplary MTJ 54. However, other MTJ configurations can be used in accordance with the present invention. The MTJ 54 has a first magnetic layer 56 that is ferromagnetically coupled to a second magnetic layer 58, and separated by a first insulating spacer layer 60. The first magnetic layer 56 and the second magnetic layer 58 each can be single or multi-layers of ferromagnetic materials such as nickel, iron, cobalt, or alloys thereof, including alloys having manganese, iridium, palladium or platinum therein. In a single tunnel barrier device, one layer has a fixed polarization direction and the other layer is "free" to change polarization directions. The "free layer" is used as the information storage layer. Other device structures, which are composed of multiple barriers and multiple "free" or information storage layers are possible and could be used in the MRAM architecture 20 of the present invention. Materials that are suitable for the first insulating spacer layer 60 include most non-conductive materials such as aluminum oxide, hafnium oxide and other oxides, nitrides, or other suitable dielectrics, etc. Although the example of the MTJ 54 is presented with two magnetic layers (56,58), the MTJ 54 can have more than two magnetic layers and other thicknesses for the first magnetic layer 56 and the second magnetic layer 58.

Figure 3:
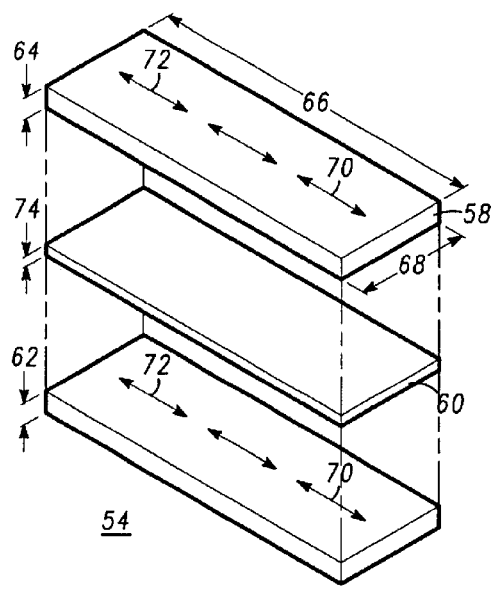
FIG. 3 is a simplified exploded view of the MTJ illustrated in FIG. 2.

Referring to FIG. 3, an enlarged exploded view is provided for the exemplary MTJ 54. In the exemplary embodiment, the first magnetic layer 56 and the second magnetic layer 58 are rectangular and are formed with the easy axis of magnetization along a length 66 rather than a width 68. However, the first magnetic layer 56 and the second magnetic layer 58 can have other shapes, such as a circular, elliptical or oval shape, and the easy axis of magnetization can be along other dimensions of the MTJ 54.

The first magnetic layer 56 and the second magnetic layer 58 each have magnetization vectors (70,72) that are positioned substantially along the length 66. Additionally, the width 68 is preferably less than the width of the magnetic domain walls or the transition width within the first magnetic layer 56 and the second magnetic layer 58. Consequently, the magnetization vectors (70,72) are not parallel to the width 68, and widths of less than about one micron (1.0 $\mu$m) to about one and two-tenths microns (1.2 $\mu$m) result in such a constraint. In the preferred embodiment, the width 68 is less than about one micron (1.0 $\mu$m), and the length 66 is greater than width 68. Preferably the length 66 is about twice the size of the width 68.

Referring to FIG. 2 and FIG. 3, the magnetization vectors (70,72) in the first magnetic layer 56 and the second magnetic layer 58 represent two different states of magnetization within the MTJ 54. The two different states of magnetization represented by the magnetization vectors are assigned logical values to distinguish between the different magnetization states. For example, one magnetization state is designated as a logical "0" and the other magnetization state is designated as a logical "1". However, other designations can be utilized in accordance with the present invention to distinguish between the different states of magnetization. In addition, while any logical definition can be assigned to either magnetization state, a logical "0" is indicated in this example when the magnetization vector 70 of the first magnetic layer 56 and the magnetization vector 70 of the second magnetic layer 58 are both aligned in substantially the same direction. Furthermore, when the magnetization vectors 72 of the first magnetic layer 56 and the second magnetic layer 58 are aligned in substantially opposite directions, a logical "1" is indicated in this example. Thus, a first orientation of the magnetization vectors 70 in the first magnetic layer 56 and the second magnetic layer 58 provide a first magnetization state of the MTJ 54 and a second orientation of the magnetization vectors 72 in the first magnetic layer 56 and the second magnetic layer 58 provides a second magnetization state of the MTJ 54.

In accordance with the present invention, the MTJ 54 can be operated in any number of modes. For example, the MTJ 54 can be operated in an antiferromagnetic mode and a spin valve mode. In the antiferromagnetic mode, the resting states of the two magnetic layers (56,58) are at least substantially anti-parallel. These two states can be used as logical "0" and logical "1" states. In the spin valve mode, one of the magnetization layers (56,58) is pinned and the other magnetization layer can be switched to be either parallel or antiparallel to the pinned layer. These parallel and antiparallel states of magnetization vectors (70,72) can be used as logical states.

The provision of the first magnetic layer 56 and the second magnetic layer 58 (i.e., the ferromagnetic layers of the MTJ 54) with the first insulating spacer layer 60 produces a tunneling junction which allows a flow of current perpendicularly through the first insulating spacer layer 60 from the first magnetic layer 56 to the second magnetic layer 58 or from the second magnetic layer 60 to the first magnetic layer 58. The MTJ 54 presents relatively high electrical resistance that is generally several thousand ohms ($\Omega$). However, the MTJ 54 can be configured to provide resistances that are less than several thousand ohms and resistances that are greater than several thousand ohms. When the magnetization vectors (72) in the first magnetic layer 56 and the second magnetic layer 58 are antiparallel, the MTJ 54 presents a first resistance and when the magnetization vectors (70) in the first magnetic layer 56 and the second magnetic layer 58 are parallel, the MTJ 54 presents a second resistance that is less than the first resistance.

In a specific example, the first magnetic layer 56 is formed of cobalt (Co) having a thickness 62 of approximately one thousand angstroms (1000 Å), the first insulating spacer layer 60 is formed of aluminum oxide ($Al_2O_3$) having a thickness 74 of less than approximately forty angstroms (40 Å), and the second magnetization layer 58 is formed of nickel iron (NiFe) having a thickness 64 of approximately one thousand angstroms (1000 Å). This configuration of the MTJ 54 provides a change of resistance versus the resistance ($\Delta R/R$) that is approximately fifteen percent (15%). Thus, a change of resistance in the MTJ 54 can be read as a change in voltage drop across the MTJ 54, which can be conveniently used in conjunction with memory arrays and the like. In accordance with the present invention, the change of an equivalent resistance ($R_{eq}$) for more than one MTJ of a ganged memory cell is utilized in determining a logical state of a single MTJ in the ganged memory cell.

Referring to FIG. 1, the memory cells of the ganged memory cells (38,48,50,52) are coupled in series, and more preferably connected in series. For example, a second MTJ terminal 76 of the first memory cell 30 is connected to the second MTJ terminal 78 of the second memory cell 32, the first MTJ terminal 80 of the second memory cell 32 is connected to the first MTJ terminal 84 of the third memory cell 34, and the second MTJ terminal 82 of the third memory cell 34 is connected to the second terminal 86 of the fourth memory cell. As can be appreciated by those of ordinary skill in the art, the equivalent resistance (Req) for the MTJs 54 of the first ganged memory cell 38, and other ganged memory cells (38,48,50,52) having MTJs coupled in series is as follows:

$$Req = R_{MTJ1} + R_{MTJ2} + \ldots + R_{MTJN} \quad (1)$$

Where $R_{MTJN}$ is the resistance associated with an MTJ in the ganged memory cell, and N is the number of MTJs that are connected in series. As will be subsequently described in greater detail, the equivalent resistance of a ganged memory cell can be determined before altering the magnetization state (i.e., altering the resistance) of a single MTJ in the ganged memory cell and the equivalent resistance can be determined after altering the magnetization state of the single MTJ cell in the ganged memory cell. The change in the equivalent resistance, which will be substantially due to the change in the resistance of the single MTJ with the change in the magnetization state, can be evaluated and the state of the changed MTJ can be determined in accordance with the present invention.

Figure 4:
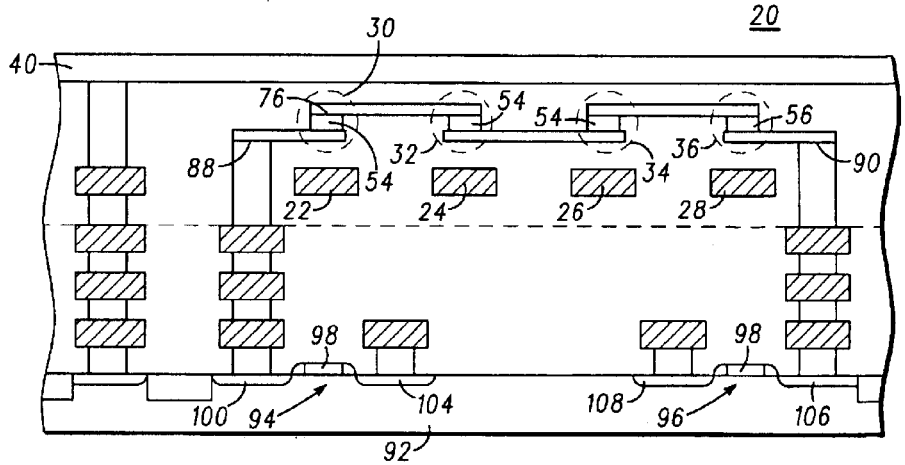
FIG. 4 is a sectional view of the MRAM architecture of FIG. 1 as formed on a substrate in accordance with an exemplary embodiment of the present invention.

Referring to FIG. 4, a cross-sectional view is illustrated for the MRAM architecture 20. The cross-sectional view illustrates that vias and interconnect lines, which are illustrated as T-shaped structures, couple the memory cells (30,32,34,36) of the first ganged memory cell 38 on a substrate 92, which is preferably a semiconductor substrate. A first control transistor 94 and a second control transistor 96 are formed as Metal-Oxide Semiconductor Field Effect Transistors (MOSFETS) in substrate 92 using standard semiconductor techniques. However, other transistors can be used in accordance with the present invention. A transistor control line 98 is formed and configured to operate as the gate terminals for the first control transistor 94 and the second control transistor 96. The drain 100 of the first control transistor 94 is connected to the first MTJ terminal 88 of the first memory cell 30, the source 102 of the first control transistor 94 is connected to a first gang input terminal 104, the drain 106 of the second control transistor 96 is connected to first MTJ terminal 90 of the fourth memory cell 36 and the source of the second control transistor 96 is connected to a first ganged output terminal 108. In addition, the bit line 40 (BL0) and programming lines (22,24,26,28) are formed with metallization steps using standard semiconductor techniques so as to position the MTJs 54 of the memory cells adjacent to the bit line 40 and programming lines (22,24,26,28) as previously described in this detailed description of the invention. The programming lines (22,24,26,28) and the bit line 40 preferably positioned in close proximity to the MTJs 54 in order to reduce the programming current and magnetic interaction with adjacent rows or columns.

Figure 5:
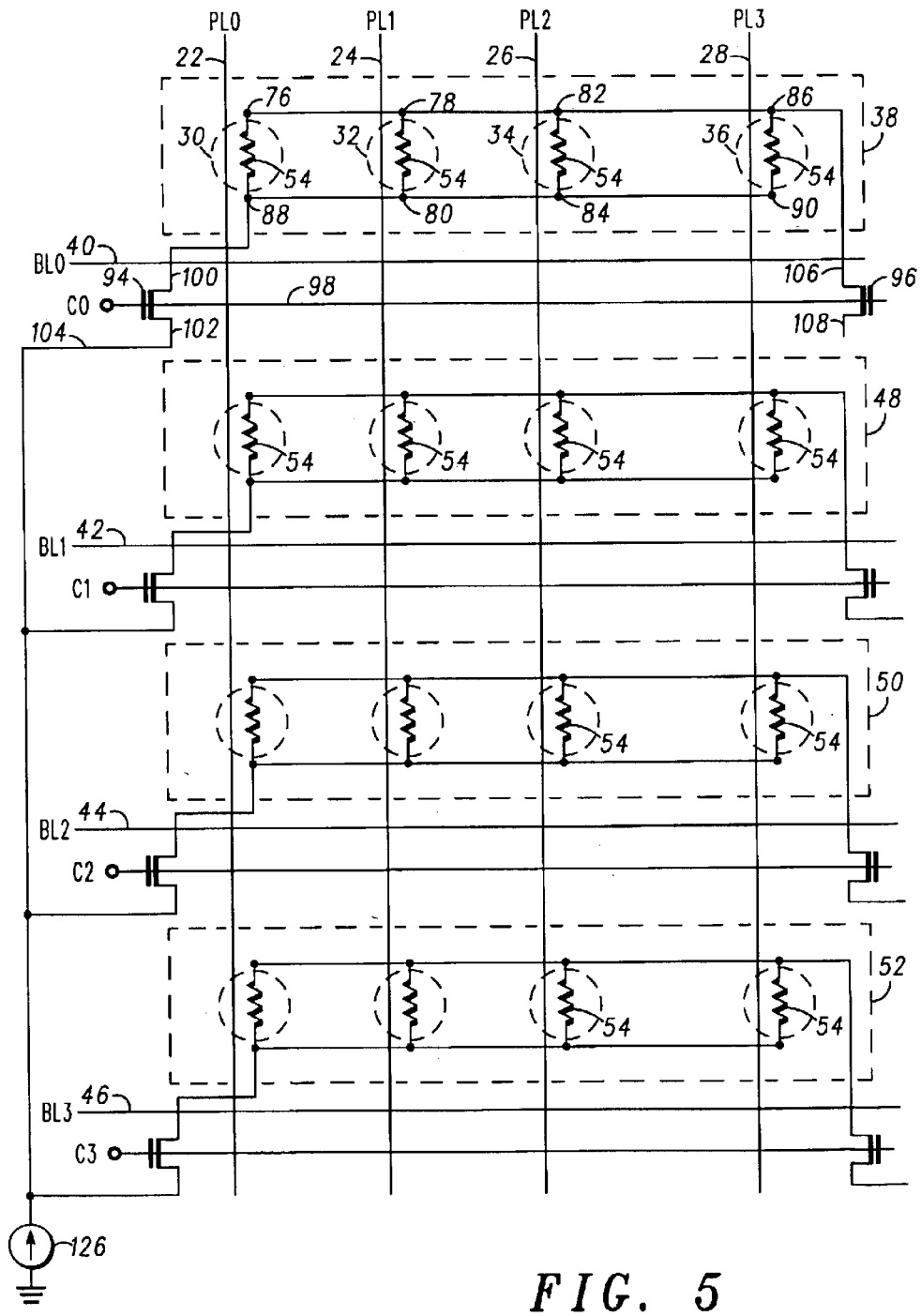
FIG. 5 is a schematic diagram of an MRAM architecture in accordance with a second exemplary embodiment of the present invention.
Figure 6:
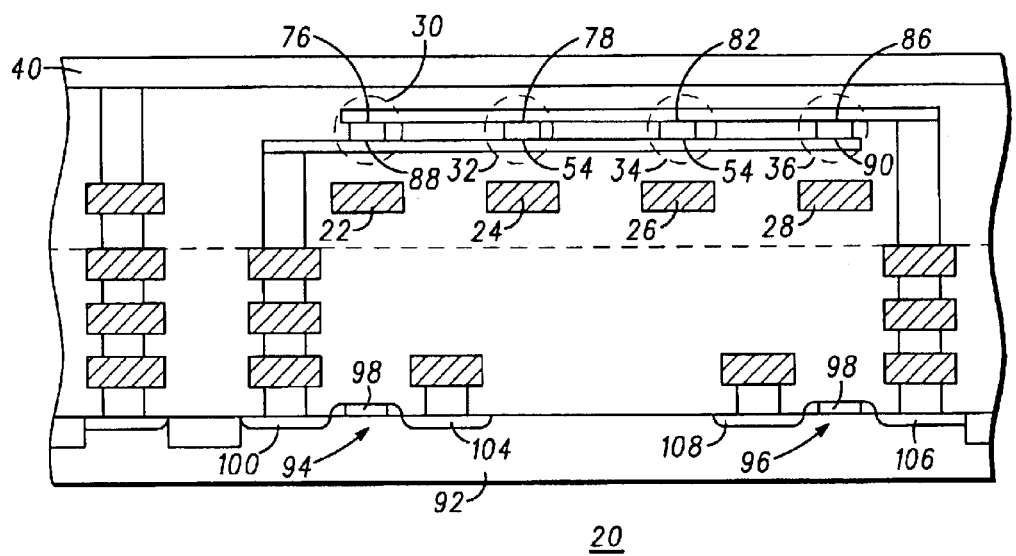
FIG. 6 is a sectional view of the MRAM architecture of FIG. 5 as formed on a substrate in accordance with an exemplary embodiment of the present invention.

Referring to FIG. 5 and FIG. 6, a second exemplary embodiment of the present invention is illustrated with the memory cells of the ganged memory cells (38,48,50,52) coupled in parallel, and more preferably connected in parallel. For example, a second MTJ terminals 76 of the first memory cell 30 is connected to the second MTJ 78 terminal of the second memory cell 32, the second MTJ terminal 78 of the second memory cell 32 is connected to the second MTJ terminal 82 of the third memory cell 34, and the second MTJ terminal 82 of the third memory cell 34 is connected to the second MTJ terminal 80 of the fourth memory cell 36. In addition, a first MTJ terminal 88 of the first memory cell 30 is connected to the first MTJ terminal 86 of the second memory cell 32, the first MTJ terminal 80 of the second memory cell 32 is connected to the first MTJ terminal 84 of the third memory cell 34, and the first MTJ terminal 84 of the third memory cell 34 is connected to the first MTJ terminal 90 of the fourth memory cell 36. As can be appreciated by those of ordinary skill in the art, the equivalent resistance ($R_{eq}$) for the MTJs 54 of the first ganged memory cell 38, and other ganged memory cells (38,48,50, 52) having MTJs coupled in parallel is as follows:

$$1/R_{eq} = 1/R_{MTJ1} + 1/R_{MTJ2} + \ldots + 1/R_{MTJN} \quad (2)$$

Where $R_{MTJN}$ is the resistance associated with an MTJ in the ganged memory cell, and N is the number of MTJs that are connected in parallel. This equivalent resistance of the ganged memory cell can be used to read the state of an MTJ in the ganged memory cell, and other MTJs couplings can be used in accordance with the present invention, including parallel and series combinations of MTJs.

Figure 7:
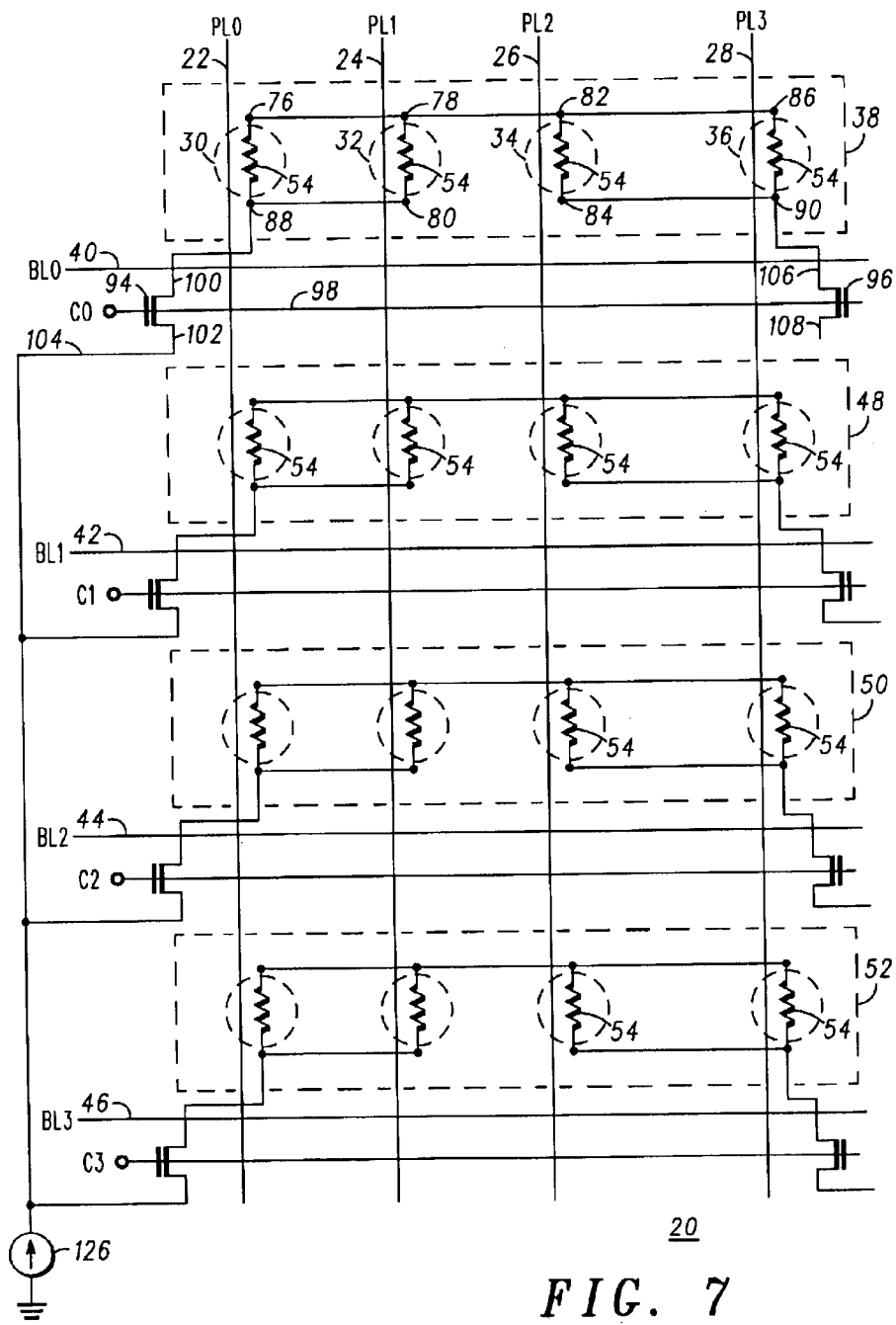
FIG. 7 is a schematic diagram of an MRAM architecture in accordance with a third exemplary embodiment of the present invention.
Figure 8:
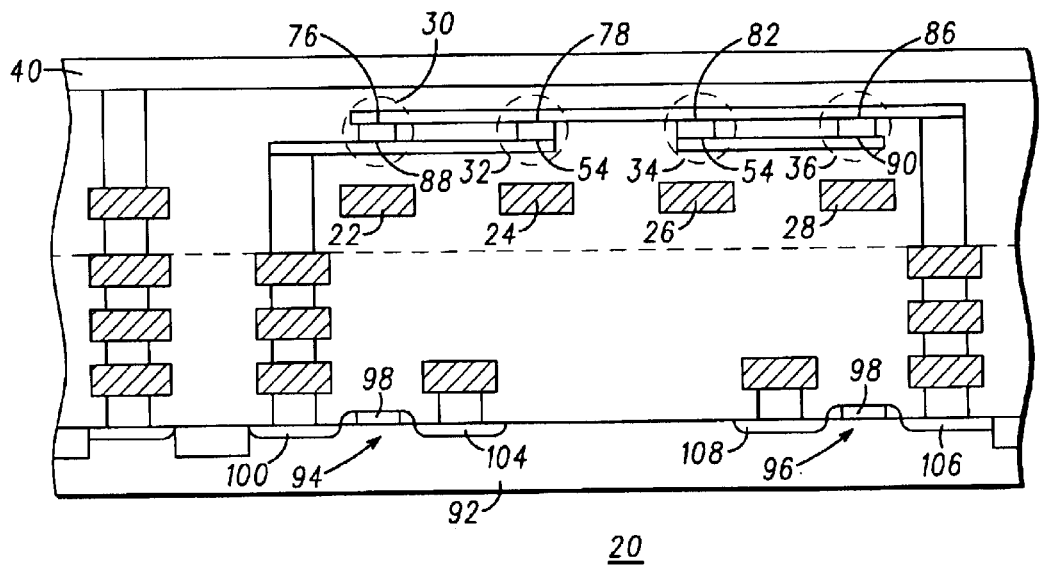
FIG. 8 is a sectional view of the MRAM architecture of FIG. 7 as formed on a substrate in accordance with an exemplary embodiment of the present invention.

Referring to FIG. 7 and FIG. 8, a third exemplary embodiment of the present invention is illustrated with the memory cells of the ganged memory cells (38,48,50,52) coupled in parallel and in series, and more preferably connected in parallel and in series. For example, the first memory cell 30 is connected in parallel with the second memory cell 32 to form a first memory cell group, the third memory cell 34 is connected in parallel with the fourth memory cell 36 to form a second memory cell group, and the first memory cell group is connected in series with the second memory cell group. More specifically, and by way of example only, the first MTJ terminal 76 of the first memory cell 30 is connected to the first MTJ terminal 78 of the second memory cell 32, the second MTJ terminal 88 of the first memory cell 30 is connected to the second MTJ terminal 80 of the second memory cell 32, the first MTJ terminal 82 of the third memory cell 34 is connected to the first MTJ terminal 86 of the fourth memory cell 36, the second MTJ terminal 84 of the third memory cell 34 is connected to the second MTJ terminal 90 of the fourth memory cell 36, and one of the MTJ terminals (78,80) of the second memory cell 32 is connected to one of the terminals (82,84) of the third memory cell 34. As can be appreciated by those of ordinary skill in the art, the equivalent resistance ($R_{eq}$) for the MTJs 54 of the first ganged memory cell 38, and other ganged memory cells (38,48,50,52) having MTJs coupled in parallel and series combination is as follows:

$$R_{eq} = \frac{R_{MTJ1} * R_{MTJ2}}{R_{MTJ1} + R_{MTJ2}} + \frac{R_{MTJ3} * R_{MTJ4}}{R_{MTJ3} + R_{MTJ4}} \quad (3)$$

As with the other exemplary embodiments, this equivalent resistance of the ganged memory cell can be used to read the state of a single memory cell in the ganged memory cell, and other MTJs couplings with any number of MTJs in a ganged memory cell can be used in accordance with the present invention, including parallel and series combinations of MTJs.

As previously described in this detailed description of the invention, a first resistance is presented by an MTJ when the magnetization vectors in the first magnetic layer and the second magnetic layer are anti-parallel, and a second resistance is presented by the MTJ that is less than the first resistance when the magnetization vectors in the first magnetic layer and the second magnetic layer are parallel. Accordingly, a first equivalent resistance is presented by a ganged memory cell when the first magnetization layer and the second magnetization layer of an MTJ in the ganged memory cell are anti-parallel, and a second equivalent resistance that is less than the first equivalent resistance is presented by ganged memory cell when the first magnetization layer and the second magnetization layer of the MTJ in the ganged memory cell are parallel. Therefore, a single MTJ in a ganged memory cell can be read by measuring an electrical property of the ganged memory cell associated with the equivalent resistance before changing the magnetization state of the single MTJ and after changing the magnetization state of the single MTJ as the equivalent resistance of the ganged memory cell will increase if the resistance of the single MTJ increases and decrease if the resistance of the single MTJ decreases.

For example, a single MTJ (e.g., second memory cell 32) in a ganged memory cell (e.g., first ganged memory cell 38) as shown in FIG. 1 can be read by measuring a first voltage drop across the ganged memory cell, changing the magnetization state of the MTJ in the memory cell of the ganged memory cell to be read, measuring a second voltage drop across the ganged memory cell after changing the magnetization state of the MTJ in the memory cell of the ganged memory cell to be read, and comparing the first voltage drop and the second voltage drop across the ganged memory cell. If the first voltage drop is greater than the second voltage drop, the equivalent resistance of the ganged memory cell decreased with the change in the magnetization state of the MTJ. Therefore, the resistance of the MTJ decreased and the magnetization layers of the MTJ were originally anti-parallel. However, if the first voltage drop is less that the second voltage drop, the equivalent resistance of the ganged memory cell increased with the change in the magnetization state of the MTJ of the MTJ. Therefore, the resistance of the MTJ increased and the magnetization layers of the MTJ were originally anti-parallel.

Figure 9:
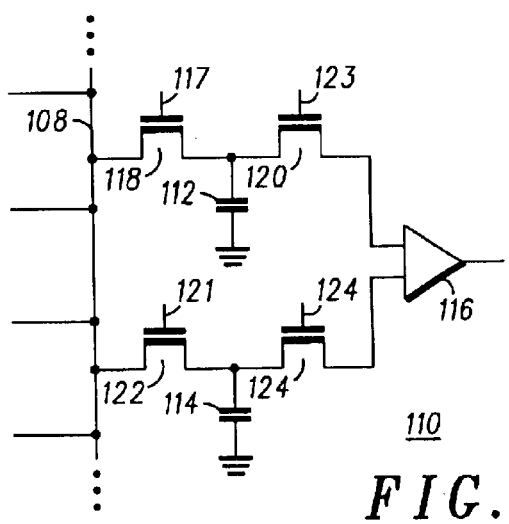
FIG. 9 is a schematic diagram of an apparatus for reading a memory cell in accordance with an exemplary embodiment of the present invention.

Referring to FIG. 9, a schematic diagram of an apparatus 110 for reading a memory cell in accordance with an exemplary embodiment of the present invention. However, any number of methods and apparatus can be used for reading a memory cell in the MRAM architecture of the present invention. The apparatus 110 includes a first storage device 112 and a second storage device 114 for storing voltages at the ganged output terminal 108 associated with one of the ganged memory cells. In addition, the apparatus 110 includes a comparator 116 for comparing the voltages stored by the first storage device 112 and the second storage device 114. Furthermore, the apparatus 110 includes switches (118,120,122,124), such as MOSFETs, that are activated and deactivated in a predefined sequence to store an original voltage of the ganged memory cell, store a subsequent voltage of the ganged memory cell after changing the magnetization state of the single MTJ in the ganged memory cell to be read, and provide the original voltage and the subsequent voltage to the comparator 116.

More specifically, and with momentary reference to FIG. 1, FIG. 5, and FIG. 7, at a first time ($t_1$), one of the ganged memory cells (38,48,50,52) having the memory cell to be read is coupled to a source 126, which can be any number of sources, such as a current source. The ganged memory cell having the memory cell to be read is also coupled to the ganged output terminal 108. The coupling of a ganged memory cell can be accomplished using any number of techniques. For example, a voltage is applied to the gate 98 of the first control transistor 94 and the second control transistor 96 associated with the first ganged memory cell 38 to couple the first ganged memory cell 38 to the source 126 and the ganged output terminal 108. As can be appreciated by those of ordinary skill in the art, at least one of the first control transistor 94 and/or the second control transistor 96, and other control transistors associated with a ganged memory cell, is configured to electrically isolate the memory cells of the ganged memory cell. Therefore, the first control transistor 94 and/or second control transistor 96, and other control transistors associated with the ganged memory cells, are isolations devices, and at least the number of isolation devices for a ganged memory cell is less than the number of memory cells in the ganged memory cell.

Referring to FIG. 9, at a second time ($t_2$), a first switch 118 is activated to electrically couple the ganged memory cell to the first storage device 112 such that a first voltage of the ganged memory cell (i.e., an original voltage) is stored in the first storage device 112. Once the first voltage is stored in the first storage device 112, the first switch 118 is deactivated to electrically decouple the first storage device 112 and the ganged memory cell. The coupling and decoupling with the first switch 118 can be accomplished using any number of techniques. For example, a voltage is applied to the gate 117 of the first switch 118 to couple the first storage device 112 and the ganged memory cell and the voltage is withdrawn from the gate 117 to decouple the first storage device 112 and the ganged memory cell.

At a third time ($t_3$), a magnetic field is applied to the MTJ of the memory cell that is to be read in order to change the magnetization state of the MTJ. As known to those of ordinary skill in the art, the magnetic field for changing the magnetization state of the MTJ can be selectively applied to a single MTJ with selective activation of the bit line and the programming line adjacent to the MTJ of interest. For example, and with momentary reference to FIG. 1, FIG. 4, and FIG. 7, a magnetic field can be selectively applied to the second memory cell 32 with the introduction of a current in the second programming line (PL1) 24 and introduction of a current in the first bit line 40, such that the cumulative magnetic field provided by the currents in the first bit line 40 and the second programming line (PL1) 24 changes the magnetization state of the MTJ 54, while the magnetization state of memory cells receiving a magnetic field from only one of the first bit line 40 and the second programming line (PL1) do not change as the field strength provided by a single line is insufficient to effect a change.

Referring to FIG. 9, at a fourth time ($t_4$), a second switch 122 is activated to electrically couple the ganged memory cell to the second storage device 114 such that a second voltage of the ganged memory cell is stored in the second storage device 114 after the magnetization state is changed in the MTJ of the memory cell of interest. Once the second voltage is stored in the second storage device 114, the second switch 122 is deactivated to electrically decouple the second storage device 114 and the ganged memory cell. The coupling and decoupling with the second switch 122 can be accomplished using any number of techniques. For example, a voltage is applied to the gate 121 of the second switch 122 to couple the second storage device 114 and the ganged memory cell and the voltage is withdrawn from the gate 121 to decouple the second storage device 114 and the ganged memory cell.

At a time ($t_5$), the third switch 120 and the fourth switch 124 are activated to electrically couple the first storage device 112 and the second storage device 114 to the comparator 116 in order to provide the first voltage and the second voltage to the comparator 116. As can be appreciated, the third switch 120 and the fourth switch 124 can be activated with the application of a voltage to the gate 119 of the third switch 120 and application of a voltage to the gate 123 to the fourth switch 124. The comparator 116 senses the difference between the first voltage and the second voltage, and the difference can be analyzed to determine the original magnetization state of the MTJ of interest as previously described in this detailed description of the invention.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A Magnetorestrictive Random Access Memory (MRAM), comprising:
   a first memory cell;
   a second memory cell coupled in parallel to said first memory cell, said second memory cell consisting of a first Magnetic Tunnel Junction (MTJ);
   a programming line and a bit line adjacent to said second memory cell; and
   a third memory cell coupled in series to said first memory cell and said second memory cell.

2. The MRAM of claim 1, wherein said first memory cell consists of a second MTJ.

3. The MRAM of claim 2, wherein said third memory cell consists of a third MTJ.

4. The MRAM of claim 3, further comprising a fourth memory cell coupled to said third memory cell.

5. The MRAM of claim 4, wherein said fourth memory cell consists of a fourth MTJ.

6. The MRAM of claim 4, wherein said fourth memory cell is coupled in series with said first memory cell, second memory cell, and said third memory cell.

7. The MRAM of claim 4, wherein:
   said first memory cell is coupled in parallel to said second memory cell to form a first memory cell group;
   a third memory cell is coupled in parallel to said fourth memory cell to form a second memory cell group; and
   said first memory cell group is coupled in series with said second memory cell group.

8. A Magnetorestrictive Random Access Memory (MRAM), comprising:
   a first memory cell;
   a second memory cell coupled in parallel to said first memory cell, said second memory cell including a first Magnetic Tunnel Junction (MTJ) and excluding an isolation device;
   a programming line and a bit line adjacent to said second memory cell; and
   a third memory cell coupled in series to said first memory cell and said second memory cell.

9. The MRAM of claim 8, wherein said first memory cell includes a second MTJ and excludes and said isolation device.

10. The MRAM of claim 9, wherein said third memory cell includes a third MTJ and excludes said isolation device.

11. The MRAM of claim 10, further comprising a fourth memory cell coupled to said third memory cell.

12. The MRAM of claim 11, wherein said fourth memory cell includes a fourth MTJ and excludes said isolation device.

13. The MRAM of claim 11, wherein said fourth memory cell is coupled in series with said first memory cell, said second memory cell, and said third memory cell.

14. The MRAM of claim 11, wherein:
   said first memory cell is coupled in parallel to said second memory cell to form a first memory cell group;
   said third memory cell is coupled in parallel to said fourth memory cell to form a second memory cell group; and
   said first memory cell group is coupled in series with said second memory cell group.

15. A Magnetorestrictive Random Access Memory (MRAM) comprising:
   a first memory cell;
   a second memory cell coupled in parallel to said first memory cell, said second memory cell comprising a Magnetic Tunnel Junction (MTJ) and formed without an isolation device; and
   a programming line and a bit line adjacent to said second memory cell; and
   a third memory cell coupled in series to said first memory cell and said second memory cell.

16. The MRAM of claim 15, wherein said first memory cell comprises a second MTJ and is formed without said isolation device.

17. The MRAM of claim 16, wherein said third memory cell comprises a third MTJ and is formed without said isolation device.

18. The MRAM of claim 16, further comprising a fourth memory cell comprises a fourth MTJ and is formed without said isolation device.

19. The MRAM of claim 18, wherein said fourth memory cell comprises a fourth MTJ and is formed without said isolation device.

20. The MRAM of claim 18, wherein said fourth memory cell is coupled in series with said first memory cell.

21. The MRAM of claim 18, wherein:
   said first memory cell is coupled in parallel to said second memory cell to form a first memory cell group;
   said third memory cell is coupled in parallel to said fourth memory cell to form a second memory cell group; and
   said first memory cell group is coupled in series with said second memory cell group.

22. A Magnetorestrictive Random Access Memory (MRAM) comprising:
   a plurality of bit lines;
   a first plurality of memory cells adjacent to a first bit line of said plurality of bit lines and each of said first plurality of memory cells consists of a Magnetic Tunnel Junction (MTJ);
   a plurality of programming lines, a first programming line of said plurality of programming lines adjacent to at least of said first plurality of memory cells;
   a second plurality of memory cells coupled in parallel with said plurality of memory cells, said second plurality of memory cells adjacent to a second bit line of said plurality of bit lines in each of said second plurality of cells consisting of an MTJ;
   a first memory cell and a second memory cell of said first plurality of memory cells are coupled in parallel to form a first memory cell group; and a third memory cell and a fourth memory cell of said first plurality of memory cells are coupled in parallel to form a second memory cell group, wherein said first memory cell group is coupled in series with said second memory cell group.

23. A Magnetorestrictive Random Access Memory (MRAM) comprising:

a plurality of bit lines;

a first plurality of memory cells adjacent to a first bit line of said plurality of bit lines and each of said first plurality of memory cells consists of a magnetic tunnel junction (MTJ);

a plurality of programming lines, a first programming line of said plurality of programming lines adjacent to at least of said first plurality if memory cells; and a second plurality of memory cells coupled in series with said first plurality of memory cells, said second plurality of memory cells adjacent to a second bit line of said plurality of bit lines and each of said second plurality of cells consist of said MTJ.

* * * * *

UNITED STATES PATENT AND TRADEMARK OFFICE
CERTIFICATE OF CORRECTION

PATENT NO. : 6,888,743 B2
DATED : May 3, 2005
INVENTOR(S) : Durlam et al.

It is certified that error appears in the above-identified patent and that said Letters Patent is hereby corrected as shown below:

<u>Title page,</u>
Item [75], Inventor, "Clarance J. Tracy" should be -- Clarence J. Tracy. --

Signed and Sealed this

Twelfth Day of July, 2005

JON W. DUDAS
*Director of the United States Patent and Trademark Office*